US011398459B2

(12) United States Patent
Wang et al.

(10) Patent No.: US 11,398,459 B2
(45) Date of Patent: Jul. 26, 2022

(54) DISPLAY SUBSTRATE AND MANUFACTURING METHOD THEREFOR AND DISPLAY DEVICE THEREOF

(71) Applicant: BOE Technology Group Co., Ltd., Beijing (CN)

(72) Inventors: Can Wang, Beijing (CN); Jiao Zhao, Beijing (CN); Han Yue, Beijing (CN); Can Zhang, Beijing (CN); Minghua Xuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 204 days.

(21) Appl. No.: 16/860,119

(22) Filed: Apr. 28, 2020

(65) Prior Publication Data

US 2021/0134767 A1    May 6, 2021

(30) Foreign Application Priority Data

Oct. 31, 2019   (CN) .......................... 201911052365.8

(51) Int. Cl.
*H01L 25/075* (2006.01)
*H01L 27/12* (2006.01)
(Continued)

(52) U.S. Cl.
CPC ...... *H01L 25/0753* (2013.01); *H01L 27/1214* (2013.01); *H01L 33/60* (2013.01);
(Continued)

(58) Field of Classification Search
CPC . H01L 25/0753; H01L 27/1214; H01L 33/60; H01L 33/62; H01L 2933/0058;
(Continued)

(56) References Cited

U.S. PATENT DOCUMENTS 10,770,441 B2    9/2020   Kuo et al.
2005/0287687 A1  12/2005   Liao et al.
(Continued)

FOREIGN PATENT DOCUMENTS

CN    1279517 A    1/2001
CN    104838508 A  8/2015
(Continued)

OTHER PUBLICATIONS

First office action of Chinese application No. 201911052365.8 dated Nov. 26, 2020.
(Continued)

*Primary Examiner* — Victor A Mandala
(74) *Attorney, Agent, or Firm* — Fay Sharpe LLP

(57) ABSTRACT

Disclosed are a display substrate and a manufacturing method therefor and a display device thereof. The display substrate includes: a drive backplate, and a plurality of micro LEDs and a retaining wall structure on the drive backplate; wherein a center of a light-emitting layer in the micro LED deviates from a center of the micro LED; the retaining wall structure is of an annular shape; the retaining wall structure corresponds to at least one micro LED in the display substrate; and a center of a surrounding region of the retaining wall structure in the drive backplate is located within a circumscribing region of a region where a light-emitting layer of the at least one micro LED is located.

20 Claims, 9 Drawing Sheets

(51) Int. Cl.
*H01L 33/60* (2010.01)
*H01L 33/62* (2010.01)

(52) U.S. Cl.
CPC ...... *H01L 33/62* (2013.01); *H01L 2933/0058* (2013.01); *H01L 2933/0066* (2013.01)

(58) Field of Classification Search
CPC ........... H01L 2933/0066; H01L 25/167; H01L 21/67763; H01L 21/67775; H01L 25/50; G09G 3/32; G09G 2300/04
See application file for complete search history.

(56) References Cited

U.S. PATENT DOCUMENTS

| | | | |
|---|---|---|---|
| 2014/0042468 A1* | 2/2014 | Inoue | H01L 33/16 257/98 |
| 2014/0048827 A1* | 2/2014 | Inoue | H01L 33/08 257/88 |
| 2014/0367633 A1* | 12/2014 | Bibl | H01L 27/3246 257/13 |
| 2014/0367705 A1* | 12/2014 | Bibl | H01L 33/44 438/27 |
| 2015/0273700 A1 | 10/2015 | Bibl et al. | |
| 2016/0013167 A1 | 1/2016 | Sakariya et al. | |
| 2016/0218143 A1 | 7/2016 | Chaji et al. | |
| 2017/0373046 A1 | 12/2017 | Gardner et al. | |
| 2018/0033768 A1 | 2/2018 | Kumar et al. | |
| 2018/0090058 A1* | 3/2018 | Chen | G09G 3/32 |
| 2019/0123096 A1 | 4/2019 | Fu et al. | |
| 2019/0198735 A1* | 6/2019 | Tsai | H01L 25/167 |
| 2019/0251894 A1 | 8/2019 | Lee et al. | |
| 2019/0259739 A1 | 8/2019 | Bibl et al. | |
| 2019/0304958 A1 | 10/2019 | Chen et al. | |
| 2020/0135991 A1* | 4/2020 | Lin | F21K 9/62 |
| 2020/0168661 A1 | 5/2020 | Xue | |
| 2020/0235127 A1 | 7/2020 | Li et al. | |
| 2021/0066267 A1* | 3/2021 | Li | H01L 27/1248 |
| 2021/0226110 A1* | 7/2021 | Yun | H01L 24/81 |
| 2021/0399040 A1* | 12/2021 | Chai | H01L 25/0753 |

FOREIGN PATENT DOCUMENTS

| | | |
|---|---|---|
| CN | 107210293 A | 9/2017 |
| CN | 107393940 A | 11/2017 |
| CN | 107680960 A | 2/2018 |
| CN | 208014702 U | 10/2018 |
| CN | 108987426 A | 12/2018 |
| CN | 109075119 A | 12/2018 |
| CN | 109285856 A | 1/2019 |
| CN | 109741684 A | 5/2019 |
| CN | 109801925 A | 5/2019 |
| CN | 109950292 A | 6/2019 |
| CN | 109994533 A | 7/2019 |
| CN | 110112171 A | 8/2019 |
| CN | 209199984 U | 8/2019 |
| CN | 110265522 A | 9/2019 |
| CN | 110391262 A | 10/2019 |
| CN | 110391294 A | 10/2019 |
| JP | 2006190851 A | 7/2006 |

OTHER PUBLICATIONS

Notification to grant patent right for invention of Chinese application No. 201911052365.8 dated Jan. 8, 2021.
Jingqiu Liang, Research Advances in Micro-LED Display Devices; OME Information vol. 27 No.12; Dec. 25, 2010, pp. 21-27.
Jianmin Huang, Research on key technology of flip chip welding industrialization of LED photoelectric device; Science & Technology Information No. 22; Aug. 3, 2015, pp. 73-74.
Xiaowei Liu et al., Analysis and improvement of a larger size TFT-LCD block mura; Chinese Journal of Liquid Crystals and Displays, vol. 31, No. 11; Nov. 15, 2016, pp. 1033-1037.

* cited by examiner

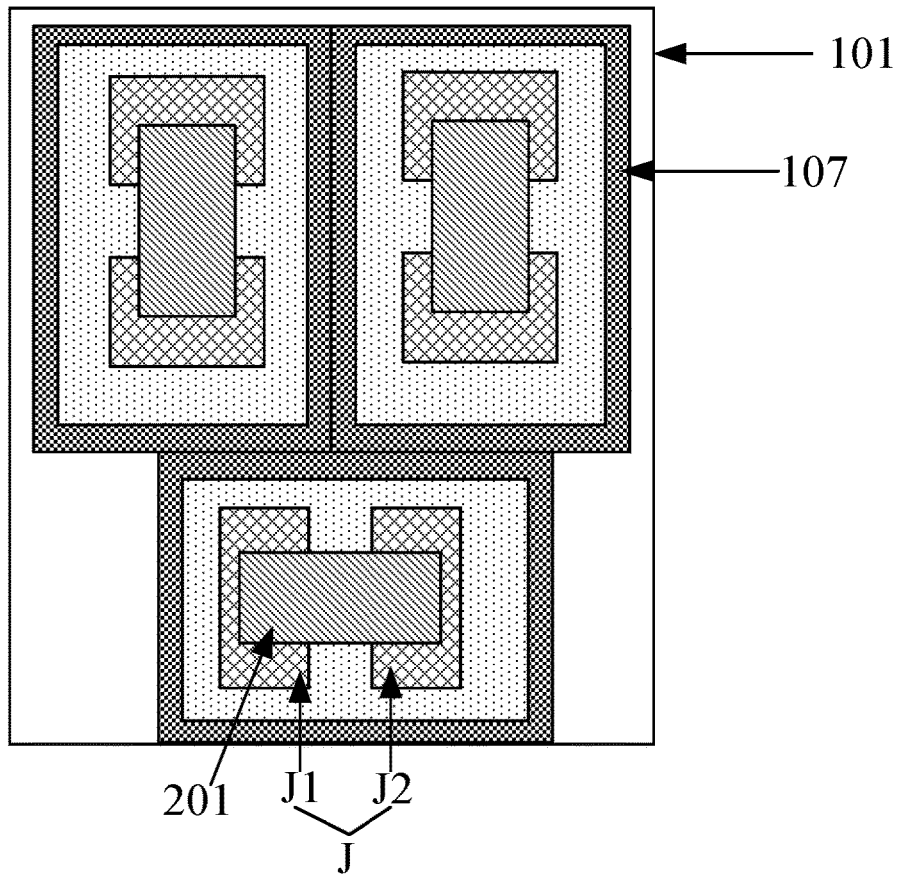

FIG. 11

Forming a plurality of Micro LEDs and retaining wall structures, wherein a center of a light-emitting layer in the Micro LED deviates from a center of the Micro LED; the retaining wall structure is of an annular shape; the retaining wall structure corresponds to at least one Micro LED in the display substrate; and a center of a surrounding region of the retaining wall structure in the drive backplate is located within a circumscribing region of a region where a light-emitting layer of the at least one Micro LED is located — 801

FIG. 12

DISPLAY SUBSTRATE AND MANUFACTURING METHOD THEREFOR AND DISPLAY DEVICE THEREOF

CROSS-REFERENCE TO RELATED APPLICATIONS

This application claims priority to Chinese Patent Application No. 201911052365.8, filed on Oct. 31, 2019 and titled "DISPLAY SUBSTRATE AND MANUFACTURING METHOD THEREFOR AND DISPLAY DEVICE THEREOF", the entire contents of which are incorporated herein by reference.

TECHNICAL FIELD

The present disclosure relates to a display substrate and a manufacturing method therefor and a display device thereof.

BACKGROUND

With the development of display technologies, micro light-emitting diode (micro LED) display substrates are highly favored. A micro LED display substrate includes a drive backplate and a plurality of micro LEDs which are arranged on the drive backplate in an array.

SUMMARY

The present disclosure provides a display substrate and a manufacturing method therefor and a display device thereof. The technical solutions are as follows:

In one aspect, a display substrate is provided. The display substrate includes: a drive backplate, and a plurality of micro LEDs and a retaining wall structure on the drive backplate; wherein a center of a light-emitting layer in the micro LED deviates from a center of the micro LED;

the retaining wall structure is of an annular shape; the retaining wall structure surrounds at least one micro LED in the display substrate; and a center of a surrounding region of the retaining wall structure in the drive backplate is located within a circumscribing region of a region where a light-emitting layer of the at least one micro LED is located.

Optionally, the center of the surrounding region coincides with a center of the circumscribing region.

Optionally, a material of the retaining wall structure includes a reflective material.

Optionally, in a direction going distally from the drive backplate, a height of the retaining wall structure is greater than a height of the micro LED.

Optionally, a distance between any position in the surrounding region and the center of the circumscribing region is greater than 5 μm.

Optionally, an inner annular surface of the retaining wall structure is an inclined surface.

Optionally, an end of the inclined surface distal from the drive backplate inclines towards an exterior of the retaining wall structure.

Optionally, the display substrate includes a plurality of retaining wall structures, and different retaining wall structures surround different micro LEDs.

Optionally, adjacent retaining wall structures in the display substrate are integrally molded.

Optionally, the micro LED is of an inverted structure.

Optionally, the display substrate also includes: an insulating flat layer on the drive backplate, and the retaining wall structures and the micro LEDS are arranged on a side, far distal from the drive backplate, of the insulating flat layer; and in a surrounding region, a surface, proximal to the micro LED, of the insulating flat layer is aligned with a surface, proximal to the micro LED, of the drive backplate.

Optionally, a material of the retaining wall structure includes a reflective material.

Optionally, the retaining wall structures and the insulating flat layer are integrally molded.

Optionally, the micro LED is of an inverted structure; a center of the surrounding region coincides with a center of a circumscribing region; a material of the retaining wall structure includes a reflective material; in a direction going distally from the drive backplate, a height of the retaining wall structure is greater than a height of the micro LED; a distance between any position in the surrounding region and the center of the circumscribing region is greater than 5 μm; an inner annular surface of the retaining wall structure is an inclined surface, and an end, far distal from the drive backplate, of the inclined surface inclines towards an exterior of the retaining wall structure; and the display substrate includes a plurality of retaining wall structures, and different retaining wall structures surround different micro LEDs and adjacent retaining wall structures in the display substrate are integrally molded.

In another aspect, a manufacturing method for the display substrate is provided. The method includes:

forming a plurality of micro LEDs and a retaining wall structure on the drive backplate, wherein a center of a light-emitting layer in the micro LED deviates from a center of the micro LED;

the retaining wall structure is of an annular shape; the retaining wall structure corresponds to at least one micro LED in the display substrate; and a center of a surrounding region of the retaining wall structure in the drive backplate is located within a circumscribing region of a region where a light-emitting layer of the at least one micro LED is located.

Optionally, before forming a plurality of micro LEDs and a retaining wall structure on the drive backplate, the method further includes:

forming an insulating flat layer on the drive backplate;

forming the plurality of micro LEDs and the retaining wall structure on the drive backplate includes:

forming the plurality of micro LEDs and the retaining wall structure on the drive backplate on which the insulating flat layer is formed; wherein in the surrounding region, a surface, proximal to the micro LED, of the insulating flat layer is aligned with a surface, proximal to the micro LED, of the drive backplate.

Optionally, forming the plurality of micro LEDs and the retaining wall structure on the drive backplate includes:

forming an insulating material layer on the drive backplate;

performing patterning on the insulating material layer to obtain an insulating flat layer and the retaining wall structure located on a side, distal from the drive backplate, of the insulating flat layer; and forming the plurality of micro LEDs on the drive backplate on which the insulating flat layer and the retaining wall structure are formed.

Optionally, the micro LED is of an inverted structure, and a center of the surrounding region coincides with a center of the circumscribing region; a material of the retaining wall structure includes a reflective material; in a direction going distally from the drive backplate, a height of the retaining wall structure is greater than a height of the micro LED; a distance between any position of the surrounding region and the center of the circumscribing region is greater than 5 μm; an inner annular surface of the retaining wall structure is an inclined surface, and an end, distal from the drive backplate, of the inclined surface inclines towards an exterior of the retaining wall structure; and the display substrate includes a plurality of the retaining wall structures, and different retaining wall structures surround different micro LEDs and adjacent retaining wall structures in the display substrate are integrally molded.

In yet another aspect, a display device is provided. The display device includes the display substrate according to the present disclosure.

BRIEF DESCRIPTION OF THE DRAWINGS

FIG. 11 is a schematic structural diagram of another display substrate according to an embodiment of the present disclosure;

FIG. 12 is a flowchart of a manufacturing method for a display substrate according to an embodiment of the present disclosure;

DETAILED DESCRIPTION

For clearer descriptions of the principles and technical solutions of the present disclosure, the implementation of the present disclosure is described in detail below in combination with the accompanying drawings.

With the development of a display technology, a micro LED serving as a sub-pixel in a display substrate is widely applied to a display substrate. A micro LED is smaller than an LED, for example, the size of the micro LED may reach to micro scale. The micro LED may include: a micro LED or a mini LED. Embodiments of the present disclosure provide a display substrate including a micro LED, and the display substrate has good display effect.

Figure 1:
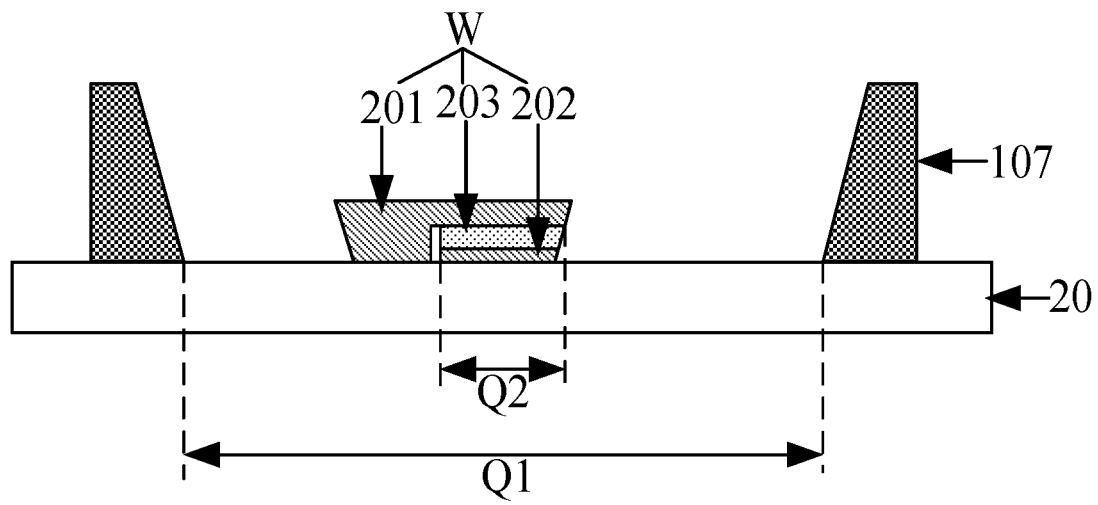
FIG. 1 is a schematic structural diagram of a display substrate according to an embodiment of the present disclosure.
Figure 2:
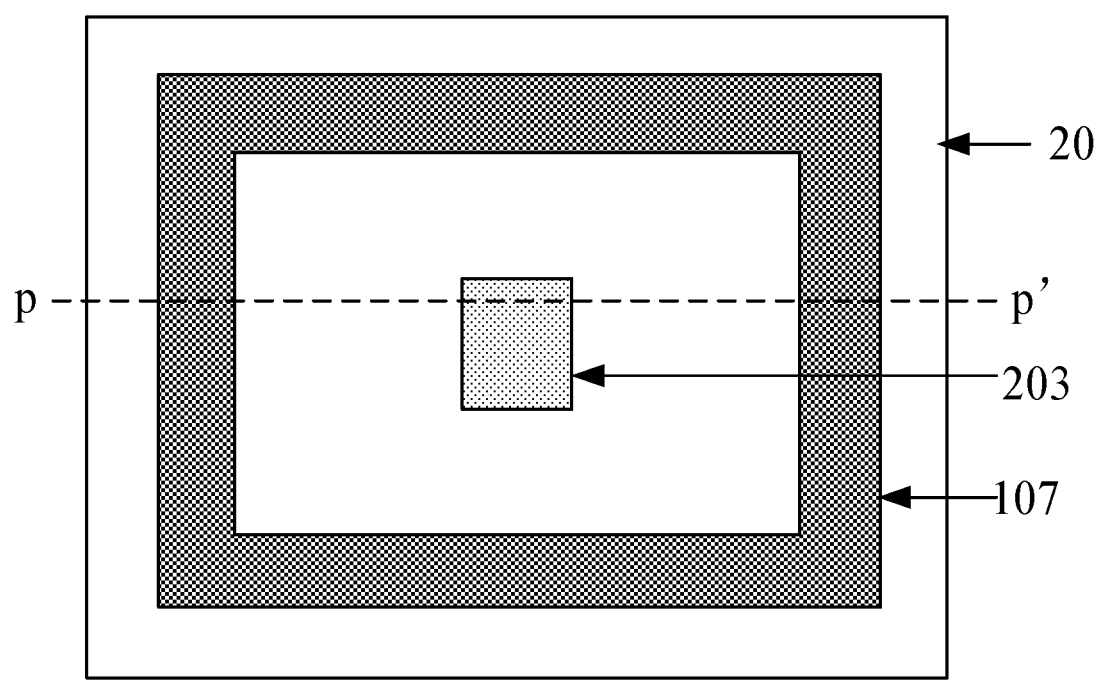
FIG. 2 is a top view of a display substrate according to an embodiment of the present disclosure.

FIG. 1 is a schematic structural diagram of a display substrate according to an embodiment of the present disclosure, and FIG. 2 is a top view of a display substrate according to an embodiment of the present disclosure. It should be noted that FIG. 1 shows a structure of a section p-p' in FIG. 2, and FIG. 2 only shows a light-emitting layer 203 in a micro LED W in FIG. 1.

Referring to FIG. 1 and FIG. 2, a display substrate 10 may include: a drive backplate 20 and a plurality of micro LEDs W and retaining wall structures 107 on the drive backplate. It should be noted that FIG. 1 and FIG. 2 only show one micro LED W and one retaining wall structure 107. The number of the micro LEDs W and the number of the retaining wall structures 107 are not limited by the embodiments of the present disclosure.

The micro LED may include: a second inject layer 202, a light-emitting layer 203, and a first inject layer 201 which are sequentially stacked on the drive backplate 20 along a direction going distally from the drive backplate 20. One of the first inject layer 201 and the second inject layer 202 is an electron inject layer, and the other one is a hole inject layer. A center of the light-emitting layer 203 deviates from a center of the whole micro LED W; and as shown in FIG. 1, the center of the light-emitting layer 203 is rightwards deviated from the center of the micro LED W, and the center of the light-emitting layer 203 also may be leftwards deviated from the center of the micro LED w.

The retaining wall structure 107 may be of an annular shape and surrounds at least one micro LED W in the display substrate 10. FIG. 1 and FIG. 2 take the retaining wall structure 107 is of a square ring shape and the retaining wall structure 107 surrounds one micro LED W as examples. Optionally, the retaining wall structure 107 may not be of a square ring shape (such as a ring shape) and the retaining wall structure 107 may surround a plurality of micro LEDs W, which is not limited by the embodiments of the present disclosure.

Figure 3:
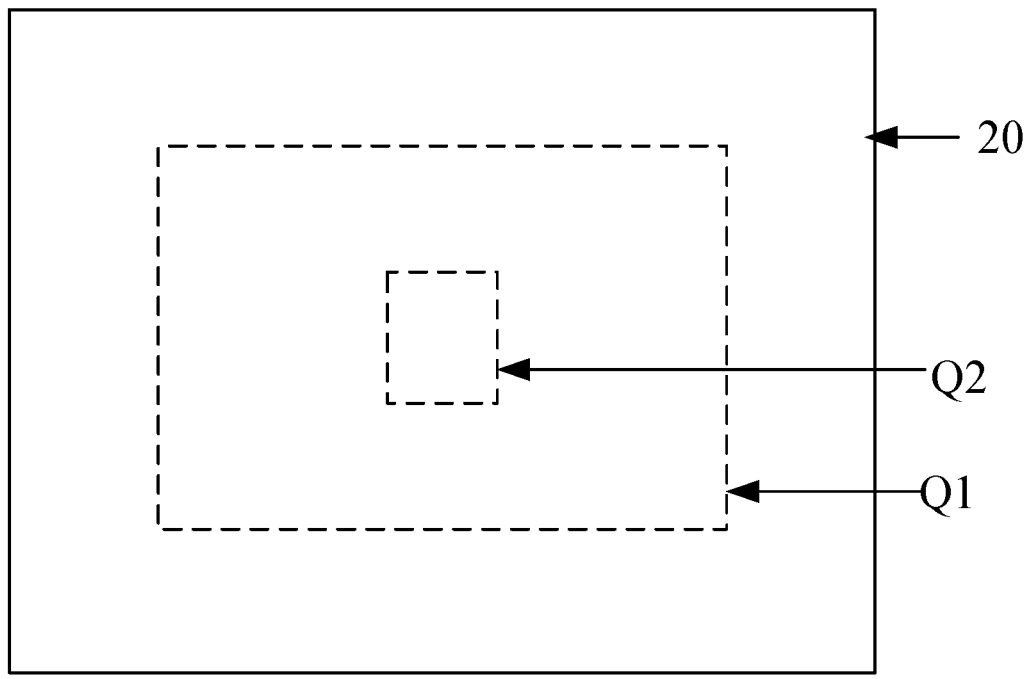
FIG. 3 is a schematic diagram of each region on a drive backplate according to an embodiment of the present disclosure.

Referring to FIG. 1, FIG. 2 and FIG. 3, in the drive backplate 20, a center of a surrounding region Q1 of the retaining wall structure 107 is located within a circumscribing region Q2 of a region where a light-emitting layer 203 of the at least one micro LED W surrounded by the retaining wall structure 107 is located. FIG. 1 and FIG. 2 take a center of a surrounding region Q1 coincides with a center of a circumscribing region Q2 as examples, of course, the center of the surrounding region Q1 may be deviated from the center of the circumscribing region Q2, which is not limited by the embodiments of the present disclosure. The circumscribing region may be a region of any shapes, such as a round region or a rectangular region, or the like.

In conclusion, in a display substrate according to the embodiments of the present disclosure, the retaining wall structure surrounds at least one micro LED. Furthermore, a center of a surrounding region of the retaining wall structure in the drive backplate is located within a circumscribing region of a region where a light-emitting layer of the at least one micro LED surrounded by the retaining wall structure is located. The light-emitting layer of the micro LED deviates from the center of the micro LED, but the retaining wall structure can correct a center of a light outgoing region of the at least one LED surrounded by the retaining wall structure to enable the center of the light outgoing region to be proximal to the center of the at least one LED, thus improving the display effect of the display substrate.

It should be noted that when the light-emitting layer of the micro LED deviates from the center of the micro LED, the shape of light emitted by the micro LED is not symmetrical. For example, if as shown in FIG. 1, the light-emitting layer 203 in the micro LED W is arranged to the right, more light is emitted from the right side of the whole micro LED W, while less light is emitted from the left side of the micro LED W. In the embodiments of the present disclosure, the center of the surrounding region Q1 is located within the circumscribing region Q2, such that under the shielding effect of the retaining wall structure 107, the center of the whole light outgoing region of the micro LED W surrounded by the retaining wall structure 107 is proximal to a region where the light-emitting layer 203 in the micro LEDS is located. Thus, the shape of light emitted by the micro LEDs tends to be symmetrical and the display effect of the display substrate is improved.

Figure 4:
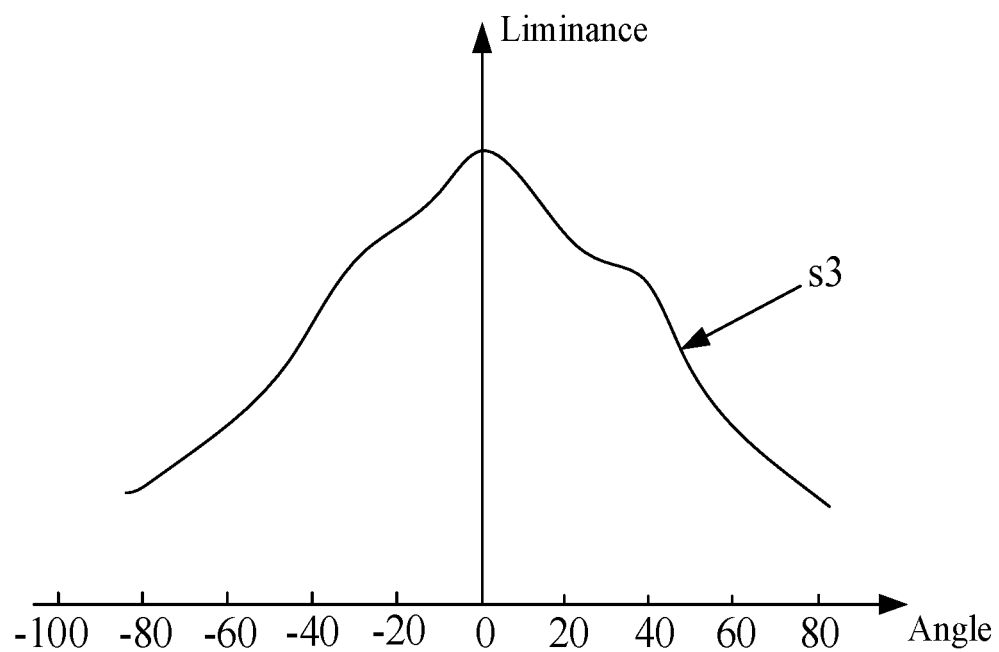
FIG. 4 is a curve graph of outgoing luminance of one LED according to an embodiment of the present disclosure.
Figure 5:
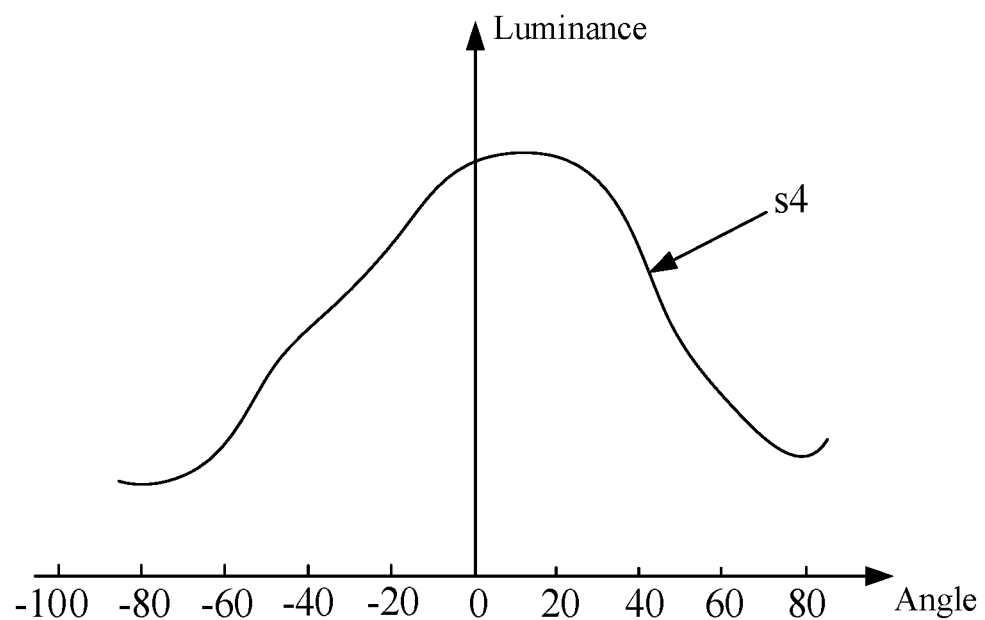
FIG. 5 is a curve graph of outgoing luminance of another LED according to an embodiment of the present disclosure.
Figure 6:
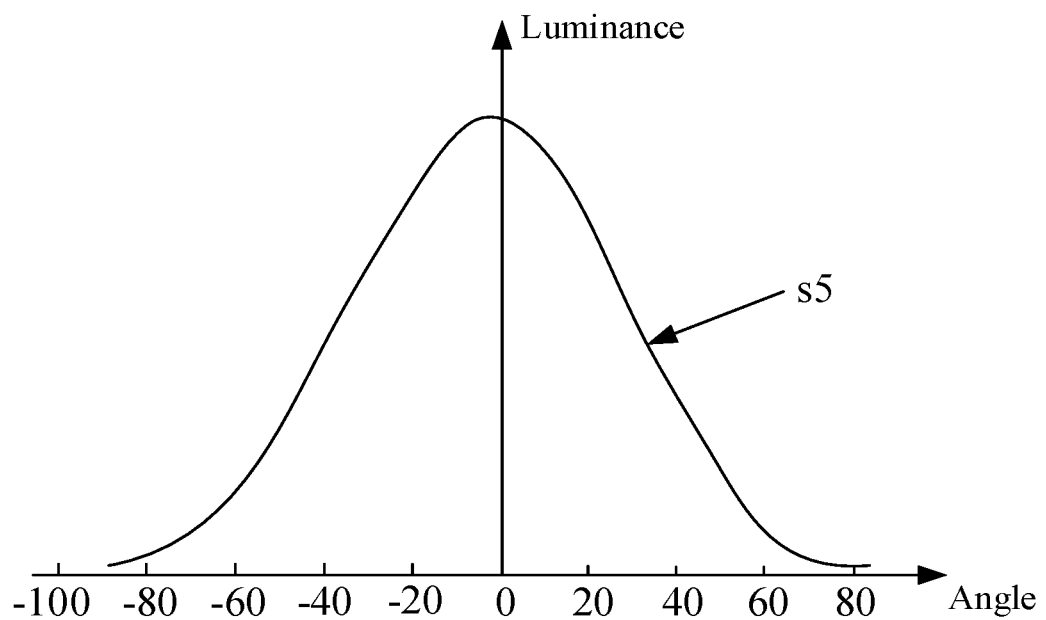
FIG. 6 is a curve graph of outgoing luminance of another LED according to an embodiment of the present disclosure.
Figure 7:
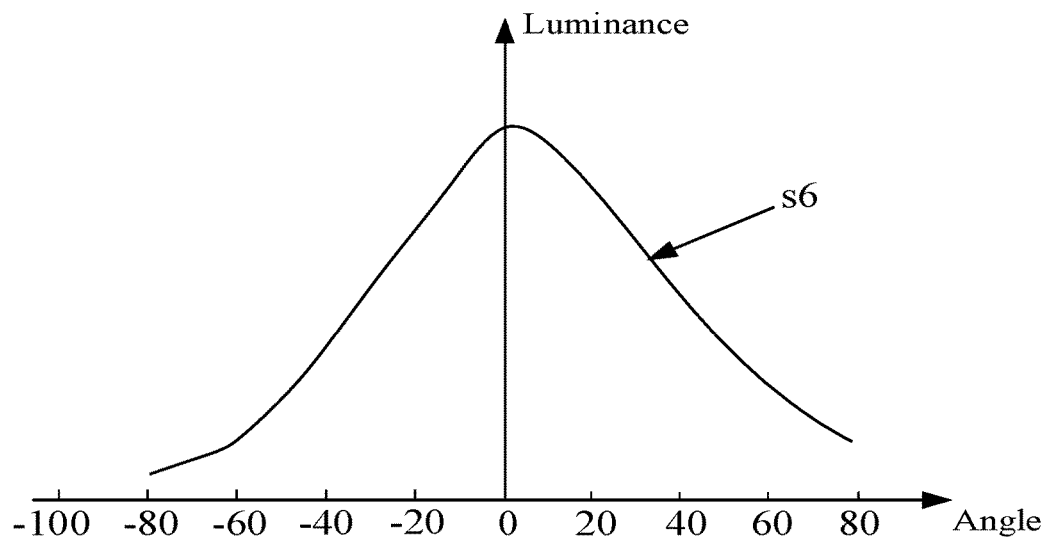
FIG. 7 is a curve graph of outgoing luminance of another LED according to an embodiment of the present disclosure.

For example, FIG. 4 and FIG. 5 are curve graphs of outgoing luminance of two micro LEDs without retaining wall structures according to embodiments of the present disclosure, and FIG. 6 and FIG. 7 are curve graphs of outgoing luminance of two micro LEDs with retaining wall structures according to embodiments of the present disclosure. A curve s3 in FIG. 4 and a curve s5 in FIG. 6 show outgoing luminance of each position of micro LEDs in a first direction, and a curve s4 in FIG. 5 and a curve s6 in FIG. 7 show outgoing luminance of each position of micro LEDs in a second direction. The first direction and the second direction are two mutually vertical directions parallel with the drive backplate. In FIG. 4 to FIG. 7, x-coordinate shows an angle of a certain position on a light outgoing surface of the micro LED, and y-coordinate shows outgoing luminance of the position. The angle of the position is an included angle between a connecting line of the position and the center of the micro LED and an axis of the micro LED, wherein the axis passes through the center of the micro LED and is vertical to the drive backplate. As can be seen from FIG. 4 and FIG. 5, when the retaining wall structure is not provided, the center of the light-emitting layer in the micro LED deviates from the center of the micro LED, such that light emitted by the whole micro LED has low degree of symmetry. As can be seen from FIG. 4 and FIG. 5, when the retaining wall structure is provided, a center of the whole light outgoing region of the micro LED surrounded by the retaining wall structure is proximal to a region where the light-emitting layer is located, and thus the light emitted by the micro LED has high degree of symmetry in terms of shape.

Optionally, in a direction going distally from the drive backplate, a height of the retaining wall structure 107 is greater than a height of the micro LED W. In this way, good shielding effect of light emitted by the micro LED W surrounded by the retaining wall structure 107 may be achieved as much as possible. For example, the height range of the retaining wall structure may be 10 μm to 16 μm.

In addition, light emitted by the micro LED usually diverges in all directions. If no retaining wall structure is provided, the forward (that is, a direction that the micro LED is distal from the drive backplate) light outgoing efficiency of the micro LED is low. Typically, when no retaining wall structure is provided, the forward light outgoing efficiency of the micro LED can only reach 9.49%. However, in the embodiments of the present disclosure, the retaining wall structure can converge light emitted by the surrounded micro LED and more light is emitted towards a direction going distally from the drive backplate, such that the forward light outgoing efficiency of the micro LED may be improved to reach 18.79%. Moreover, the retaining wall structure 107 converges light emitted by the surrounded micro LED, such that mixing of light emitted by the micro LED W in the retaining wall structure 107 and light emitted by the micro LED outside the retaining wall structure may be avoided and the contrast of the display substrate can be increased.

Figure 8:
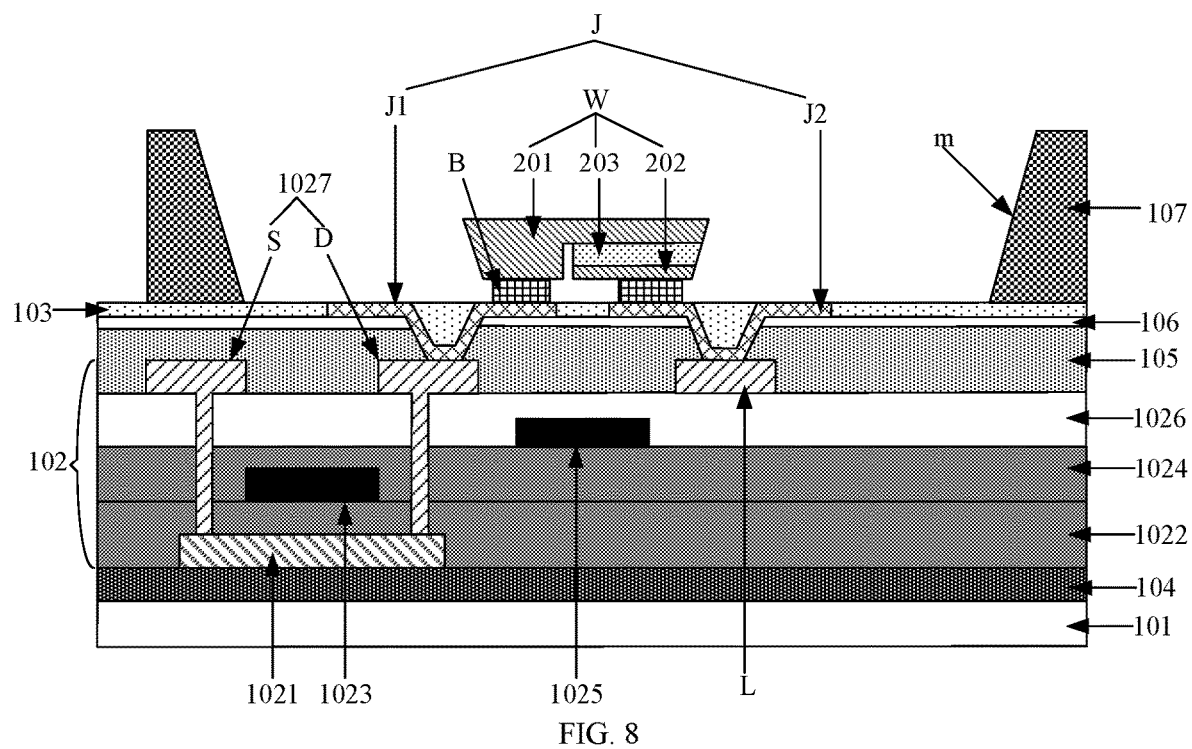
FIG. 8 is a schematic structural diagram of another display substrate according to an embodiment of the present disclosure.

Optionally, FIG. 8 is a schematic structural diagram of another display substrate according to an embodiment of the present disclosure. As shown in FIG. 8, on the basis of FIG. 1 and FIG. 2, the display substrate also includes: an insulating flat layer 103 (not shown in FIG. 8) on the drive backplate, wherein the retaining wall structure 107 and the micro LED W are arranged on a side, distal from the drive backplate, of the insulating flat layer 103. Furthermore, in the surrounding region Q1 in FIG. 1, a surface, proximal to the micro LED W, of the insulating flat layer 103 is aligned with a surface, proximal to the micro LED W, of the drive backplate 107.

For example, the drive backplate in FIG. 8 may include: a base substrate 101, a buffer layer 104, a pixel circuit layer 102, an initial flat layer 105 (a material may comprise an organic matter), a passivation layer 106, and a conductive layer (not shown in FIG. 8) which are sequentially superimposed. The pixel circuit layer 102 includes a plurality of pixel circuits which are in one-to-one correspondence with the plurality of micro LEDs, and the conductive layer includes conductive structures J which are in one-to-one correspondence with the plurality of micro LEDs. Each conductive structure J is electrically connected to the corresponding micro LEDs W. For the conductive structure J and the pixel circuit which each micro LED corresponds to, the conductive structure J may be electrically connected to the pixel circuit by via holes in the passivation layer 106 and the initial flat layer 105. A structure, proximal to the micro LED, in the drive backplate 107 may include the conductive structure J; therefore, in the surrounding region Q1 in FIG. 1, a surface, proximal to the micro LED W, of the insulating flat layer 103 is aligned with a surface, proximal to the micro LED W, of the conductive structure J.

In the surrounding region of the retaining wall structure, a surface, proximal to the micro LED W, of the insulating flat layer is aligned with a surface, proximal to the micro LED W, of the drive backplate, therefore, an interior of the surrounding region is flat. When the micro LED is arranged in the surrounding region, the setting firmness of the micro LED is high and the setting firmness may not be reduced due to the step of a setting surface.

Figure 9:
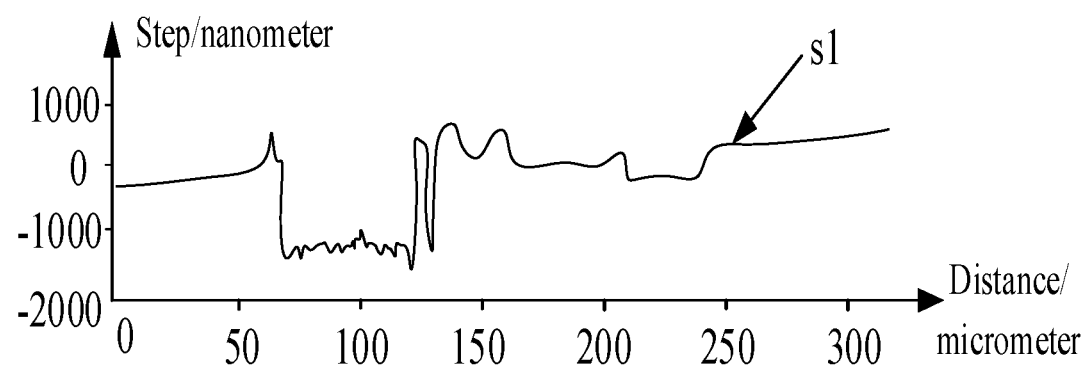
FIG. 9 is a curve graph of a surface step height of a drive backplate according to an embodiment of the present disclosure.
Figure 10:
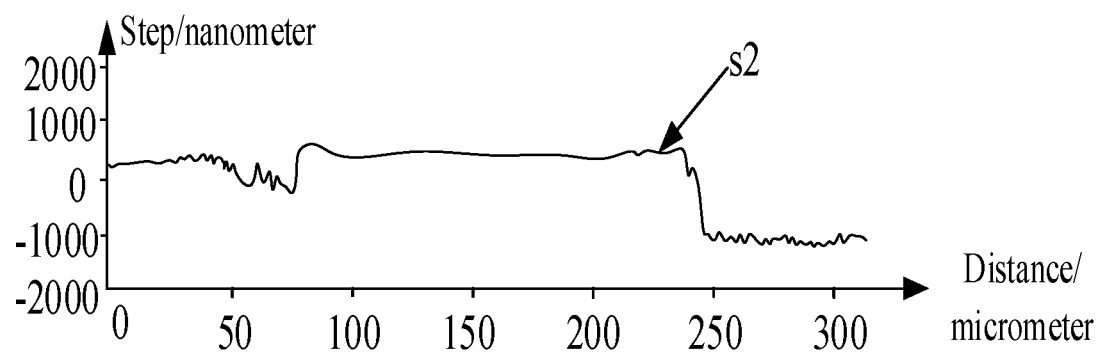
FIG. 10 is a curve graph of a surface step height of another drive backplate according to an embodiment of the present disclosure.

For example, FIG. 9 and FIG. 10 are curve graphs of surface step heights of two drive backplates according to embodiments of the present disclosure; wherein a curve s1 in FIG. 9 and a curve s2 in FIG. 10 show a step of each position of the drive backplate in two mutually vertical directions, and horizontal axes of FIG. 9 and FIG. 10 show a distance from a certain position on the drive backplate to a center of the drive backplate. As can be seen from FIG. 9 and FIG. 10, the step of the drive backplate is larger and surface roughness of the drive backplate is larger. If the insulating flat layer is not arranged on the surface of the drive backplate, located in the surface of the drive back plate are stressed non-uniformly when the micro LED is transferred to the surface of the drive backplate, resulting in high setting difficulty, low setting firmness and bad binding effect of the micro LED. However, in the embodiments of the present disclosure, the insulating flat layer is arranged on the surface of the drive backplate, the step of the drive backplate can be filled, such that a surface of a region for arranging the micro LED in the drive backplate is flat, the setting difficulty of the micro LED is reduced and the setting firmness and the binding effect of the micro LED are improved.

Optionally, a material of the insulating flat layer 103 may be a reflective material. As light emitted by the micro LED W is difficult to diverge, if a material of the insulating flat layer 103 is a reflective material, the insulating flat layer may reflect the light which is emitted by the micro LED W and emitted to the insulating flat layer to a direction going distally from the insulating flat layer 103. In this way, waste of light emitted by the micro LED is avoided and more light emitted by the micro LED may be used for displaying, and thus the luminance of the display substrate is high.

Optionally, a material of the insulating flat layer 103 may include organic resin. For example, the organic resin may include acrylic (such as white acrylic). The reflectivity of the white acrylic may reach 60% to 70%.

Optionally, on a region outside a via hole in the passivation layer and in a direction going distally from the drive backplate, a thickness of the insulating flat layer 103 may be equal to a thickness of the conductive structure J. For example, the thickness of the insulating flat layer 103 may be 2 μm; and of course, the thickness also may be greater than 1 μm or smaller than 1 μm, for example, the thickness may be 1.5 μm, 1.4 μm, 0.8 μm or 0.9 μm, or the like Further, the pixel circuit in the pixel circuit layer may include a thin film transistor, or a plurality of thin film transistors and at least one capacitor; FIG. 8 carries out illustration by taking the pixel circuit only includes one thin film transistor as an example and the thin film transistor is a thin film transistor with a top gate structure as an example. Optionally, the thin film transistor which the pixel circuit includes also may be a thin film transistor with a bottom gate structure, which is not limited by the embodiments of the present disclosure. Still referring to FIG. 8, the pixel circuit may include: an active layer 1021, a first gate insulating layer 1022, a first gate layer 1023, a second gate insulating layer 1024, a second gate layer 1025, an interlayer dielectric layer 1026, and a source and drain layer 1027 which are sequentially superimposed along a direction going distally from the base substrate 101. The source and drain layer 1027 may include a source electrode S, a drain electrode D, a first power signal line (not shown in FIG. 8), and a second power signal line L. The source electrode S is electrically connected to the first power signal line.

Still referring to FIG. 8, the conductive structure J may include a first conductive sub-structure J1 and a second conductive sub-structure J2 which are mutually insulated, wherein the first conductive sub-structure J1 is electrically connected to the drain electrode D, and the second conductive sub-structure J2 is electrically connected to the second power signal line L. The first inject layer 201 in the micro LED W may be electrically connected to the first conductive sub-structure J1, and the second inject layer 202 may be electrically connected to the second conductive sub-structure J2. In this way, based on the electric connection relation, a signal on the first power signal line can be transmitted to the first inject layer 201, and a signal on the second power signal line L can be transmitted to the second inject layer 202. Thus, the aim of supplying power to the micro LED is fulfilled to excite the light-emitting layer 203 in the micro LED to emit light. Further, in the first power signal line and the second power signal line, one power signal line is used for providing a high-level signal (Vdd) and the other power signal line is used for providing a low-level signal (Vss). In the first inject layer 201 and the second inject layer 202, the inject layer connected to the power signal line which provides the high-level signal may be named as a hole inject layer, and the inject layer connected to the power signal line which provides the low-level signal may be named as an electron inject layer.

In the embodiments of the present disclosure, a structure of the micro LED W may be a face-down structure, a face-up structure or a vertical structure, and the structure of the micro LED in the embodiments of the present disclosure is an inverted structure. The micro LEDs with the face-down structure, the face-up structure and the vertical structure are arranged on the drive backplate in different ways. The following explains the micro LEDs with the three structures respectively.

For the micro LED which is of the inverted structure, as shown in FIG. 8, the second inject layer 202, the light-emitting layer 203 and the first inject layer 201 are sequentially superimposed along a direction going distally from the base substrate 101, and an orthographic projection of a partial region in the first inject layer 201 on the base substrate is not located within an orthographic projection of the second inject layer 202 and the light-emitting layer 203 on the base substrate. The first inject layer 201 is electrically connected to the first conductive sub-structure J1 by one side, proximal to the base substrate 101, in the partial region, and the second inject layer 202 is electrically connected to the second conductive sub-structure J2 by a side, proximal to the base substrate 101, of the second inject layer 202. The micro LED which is of the inverted structure is arranged on the drive backplate, and the micro LED can be electrically connected to the conductive structure, such that the micro LED is bound on the drive backplate. Optionally, the first inject layer 201 and the second inject layer 202 may be electrically connected to the corresponding conductive sub-structures by a conductive adhesive portion B.

Optionally, the micro LED which is of the inverted structure may include a first electrode (not shown in FIG. 8) located on a side, distal from the base substrate 101, of the first inject layer 201, and a second electrode (not shown in FIG. 8) located on a side, proximal to the base substrate 101, of the second inject layer 202. The first inject layer 201 is electrically connected to the first conductive sub-structure J1 by the first electrode, and the second inject layer 202 is electrically connected to the second conductive sub-structure J2 by the second electrode.

For the micro LED which is of the face-up structure, the first inject layer, the light-emitting layer and the second inject layer are sequentially superimposed along a direction going distally from the base substrate, and a part which is not covered by the second inject layer and the light-emitting layer exists in the first inject layer. The first inject layer is electrically connected to the first conductive sub-structure by a side, distal from the base substrate, of the part, and the second inject layer is electrically connected to the second conductive sub-structure by a side, distal from the base substrate, of the second inject layer. After the micro LED which is of the face-up structure is arranged on the drive backplate, the micro LED is electrically connected to the conductive structure by a wire bonding process, such that the micro LED is bound on the drive backplate.

For the micro LED which is of the vertical structure, the first inject layer, the light-emitting layer and the second inject layer are sequentially superimposed along a direction going distally from the base substrate, and a part which is not covered by the second inject layer and the light-emitting layer exists in the first inject layer. One side, proximal to the base substrate, of the second inject layer is electrically connected to the second conductive sub-structure; and one side, distal from the base substrate, of the first inject layer is electrically connected to the first conductive sub-structure. When the micro LED is arranged on the drive backplate, the second inject layer and the second conductive sub-structure can be electrically connected. After the micro LED is arranged on the drive backplate, the first inject layer is electrically connected to the first conductive sub-structure by a wire bonding process, such that the micro LED is bound on the drive backplate.

Optionally, a distance between any position in the surrounding region and the center of the circumscribing region is greater than 5 µm. For example, referring to FIG. 8, a distance between an orthographic projection of any positions of the inner annular surface m of the retaining wall structure 107 on the base substrate 101 and an orthographic projection of the center of the light-emitting layer 203 in the micro LED W surrounded by the retaining wall structure 107 is greater than 5 µm.

Optionally, referring to FIG. 8, the inner annular surface m of the retaining wall structure 107 is an inclined surface. An end, distal from the drive backplate, of the inclined surface may be inclined towards an exterior of the retaining wall structure 107, thus preventing the retaining wall structure 107 from blocking light emitted by the surrounded micro LED W. Optionally, an acute angle of two included angles formed by the inclined surface m and the drive backplate may be in a range of 60 degrees to 70 degrees.

Optionally, an end, distal from the drive backplate, of the inclined surface may be inclined towards an interior of the retaining wall structure 107, thus further converging light emitted by the micro LED W surrounded by the retaining wall structure 107 and improving the luminance and the contrast ratio of the display substrate.

Optionally, the inner annular surface of the retaining wall structure 107 also may not be an inclined surface, but a straight surface vertical to the drive backplate, or a concave curved surface, or the like, which is not limited by the embodiments of the present disclosure.

Optionally, FIG. 11 is a schematic structural diagram of another display substrate according to an embodiment of the present disclosure, and FIG. 11 shows a top view of the display substrate. Referring to FIG. 11, the display substrate 10 may include a plurality of retaining wall structures 107, and different retaining wall structures 107 surround different micro LEDs. Optionally, the plurality of retaining wall structures 107 may be in one-to-one correspondence with a plurality of micro LEDs in the display substrate, and each retaining wall structure 107 surrounds the corresponding micro LED.

Optionally, a material of the retaining wall structure 107 according to the embodiments of the present disclosure may include a reflective material, thus the retaining wall structure 107 may reflect light emitted by the surrounded micro LED and thus the forward light outgoing efficiency of the micro LED is improved. For example, a material of the retaining wall structure 107 may include metal. Typically, the reflectivity of the metal is high, and if the retaining wall structure is made of the metal, it may be ensured that the retaining wall structure has a high reflectivity on light emitted by the micro LED and the utilization rate of the light emitted by the micro LED is further improved.

Optionally, a material of the retaining wall structure 107 may not include a reflective material, but include a light-absorbing material to absorb light which is emitted by the micro LED surrounded by the retaining wall structure 107 and is emitted to the retaining wall structure, thus preventing light emitted by different micro LEDs from being mixed and increasing the contrast ratio of the display substrate.

Optionally, the retaining wall structure 107 and the insulating flat layer 103 may be integrally molded. At this time, the material of the retaining wall structure 107 is as same as a material of the insulating flat layer 103, for example, the material of the retaining wall structure also may include organic resin, and the organic resin may include acrylic (such as white acrylic).

In conclusion, in a display substrate according to the embodiments of the present disclosure, the retaining wall structure surrounds at least one micro LED. Furthermore, a center of a surrounding region of the retaining wall structure in the drive backplate is located within a circumscribing region of a region where a light-emitting layer of the at least one micro LED surrounded by the retaining wall structure is located. The light-emitting layer of the micro LED deviates from the center of the micro LED, but the retaining wall structure can correct a center of a light outgoing region of the at least one LED surrounded by the retaining wall structure to enable the center of the light outgoing region to be proximal to the center of the at least one LED, thus improving the display effect of the display substrate.

Furthermore, in the surrounding region of the retaining wall structure, a surface, proximal to the micro LED W, of the insulating flat layer is aligned with a surface, proximal to the micro LED, of the drive back plate, such that the surrounding region is internally flat, and when the micro LED is arranged in the surrounding region, the setting firmness of the micro LED is high, and may not be reduced due to the step of a setting surface.

FIG. 12 is a flowchart of a manufacturing method for a display substrate according to an embodiment of the present disclosure, and the method may be used for manufacturing any one of display substrates according to the embodiments of the present disclosure. As shown in FIG. 12, the manufacturing method may include the following steps:

Step 801: A plurality of micro LEDs and a retaining wall structure are formed on the drive backplate; wherein a center of a light-emitting layer in the micro LED deviates from a center of the micro LED; the retaining wall structure is of an annular shape; the retaining wall structure corresponds to at least one micro LED in the display substrate; and a center of a surrounding region of the retaining wall structure in the drive backplate is located within a circumscribing region of a region where a light-emitting layer of the at least one micro LED is located.

In conclusion, in a display substrate manufactured by the method according to the embodiments of the present disclosure, the retaining wall structure surrounds at least one micro LED. Furthermore, the center of the surrounding region of the retaining wall structure in the drive backplate is located within the circumscribing region of the region where the light-emitting layer of the at least one micro LED surrounded by the retaining wall structure is located. The light-emitting layer of the micro LED deviates from the center of the micro LED, but the retaining wall structure can correct a center of a light outgoing region of the at least one LED surrounded by the retaining wall structure to enable the center of the light outgoing region to be proximal to the center of the at least one LED, thus improving the display effect of the display substrate.

Figure 13:
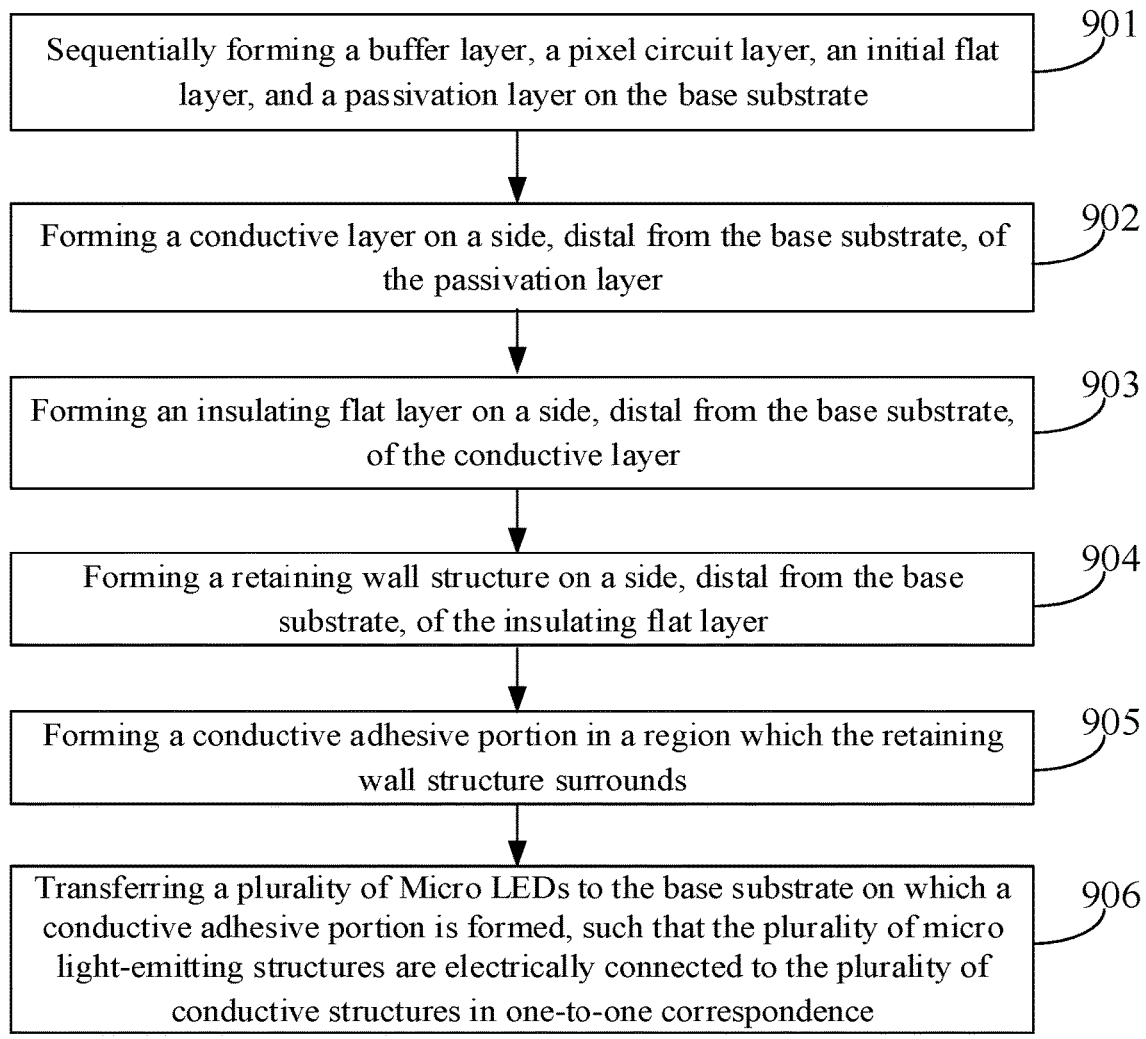
FIG. 13 is a flowchart of a manufacturing method of another display substrate according to an embodiment of the present disclosure.

FIG. 13 is a flowchart of a manufacturing method for a display substrate according to an embodiment of the present disclosure, and the method may be used for manufacturing the display substrate 10 as shown in FIG. 8. As shown in FIG. 13, the manufacturing method may include the following steps:

Step 901: A buffer layer, a pixel circuit layer, an initial flat layer, and a passivation layer are sequentially formed on the base substrate.

Figure 14:
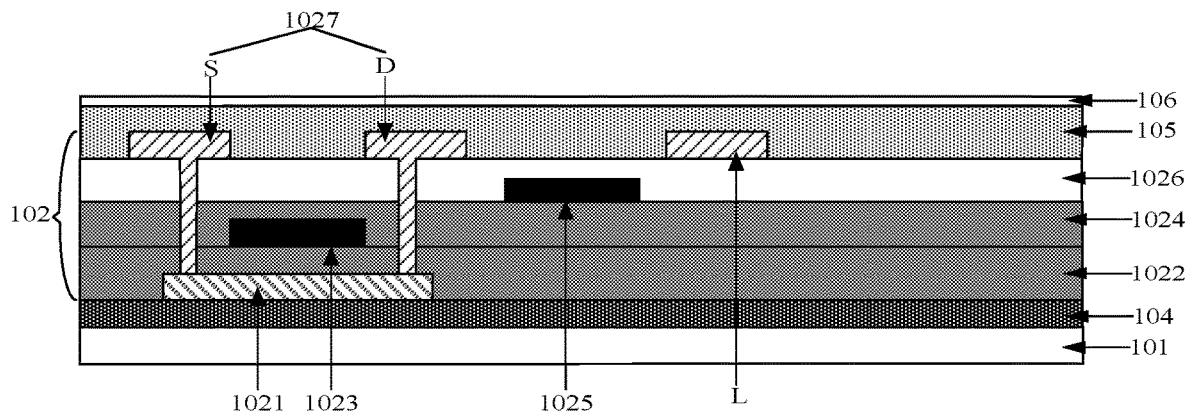
FIG. 14 is a partial schematic structural diagram of a display substrate according to an embodiment of the present disclosure.

For example, referring to FIG. 14, the buffer layer 104 may be formed on the base substrate 101 by deposition. An active layer 1021 is formed on the buffer layer 104 by a patterning process, a first gate insulating layer 1022 on the active layer 1021 by deposition, a first gate layer 1023 is formed on the first gate insulating layer 1022 by a patterning process, a second gate insulating layer 1024 is formed on the first gate layer 1023 by deposition, a second gate layer 1025 is formed on the second gate insulating layer 1024 in a patterning process, an interlayer dielectric layer 1026 is formed on the second gate layer 1025 by deposition, a source and drain layer 1027 is formed on the interlayer dielectric layer 1026 by a patterning process, and an initial flat layer 105 and a passivation 106 are sequentially formed on the source and drain layer 1027 by deposition, such that a structure as shown in FIG. 14 is obtained. The patterning process includes: photoresist coating, exposing, developing, etching and photoresist stripping. The source and drain layer 1027 includes a source electrode S, a drain electrode D, a first power signal line (not shown in FIG. 14), and a second power signal line L.

Optionally, a material for preparing the active layer includes at least one of indium gallium zinc oxide (IGZO), low temperature poly-silicon (LTPS) and low temperature polycrystalline oxide (LTPO); a material for preparing the gate insulating layer includes at least one of silicon dioxide, silicon nitride and aluminum oxide; a material for preparing the gate layer includes at least one of aluminum, neodymium and molybdenum; a material for preparing the passivation layer comprises silicon dioxide, silicon nitride and aluminum oxide; and a material for preparing the source and drain layer includes at least one of aluminum, neodymium and molybdenum.

Step 902: A conductive layer is formed on a side, distal from the base substrate, of the passivation layer.

The conductive layer may include a plurality of conductive structures which are electrically connected to a plurality of pixel circuits in one-to-one correspondence.

Figure 15:
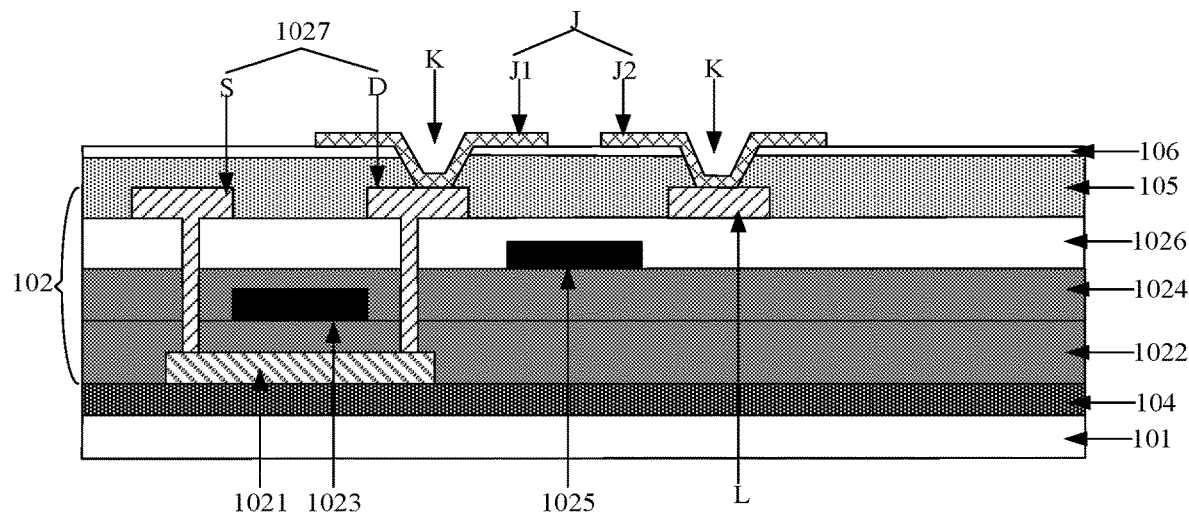
FIG. 15 is a partial schematic structural diagram of another display substrate according to an embodiment of the present disclosure.

For example, referring to FIG. 14 and FIG. 15, in the structure as shown in FIG. 14, via holes K corresponding to the drain electrode D and the second power signal line L may be formed in the passivation layer 106 and the initial flat layer 105 by a patterning process, such that the drain electrode D and the second power signal line L in the pixel circuit layer are naked by the corresponding via holes K. Then, a plurality of conductive structures J are formed on the passivation layer 106 by the patterning process, such that the structure as shown in FIG. 15 is obtained. The first conductive sub-structure J1 in the conductive structure J is electrically connected to the drain electrode D by the via hole K corresponding to the drain electrode D, and the second conductive sub-structure J2 is electrically connected to the second power signal line L by the via hole K corresponding to the second power signal line L.

Step 903: An insulating flat layer is formed on a side, distal from the base substrate, of the conductive layer.

Before step 903, the drive backplate is formed; and in step 903, the insulating flat layer is formed on the drive backplate. A surface, proximal to the micro LED, of the insulating flat layer is aligned with a surface, proximal to the micro LED W, of the drive backplate.

Figure 16:
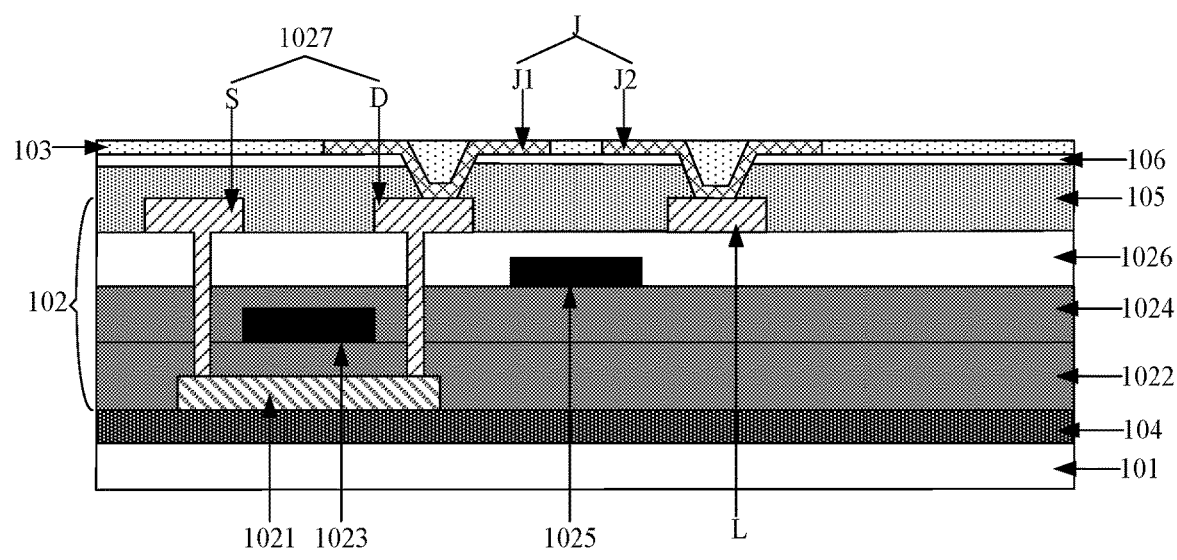
FIG. 16 is a partial schematic structural diagram of another display substrate according to an embodiment of the present disclosure.

For example, referring to FIG. 15 and FIG. 16, the structure as shown in FIG. 15 may be coated with an insulating material to form the insulating flat layer 103, thus obtaining a structure as shown in FIG. 16.

Optionally, if the surface, distal from the base substrate, of the conductive structure is covered with the insulating layer during coating of the insulating layer, the insulating material covering the surface may be removed by a target process. Optionally, the target process may include an etching process or other processes capable of removing the insulating material.

Step 904: A retaining wall structure is formed on a side, distal from the base substrate, of the insulating flat layer.

Figure 17:
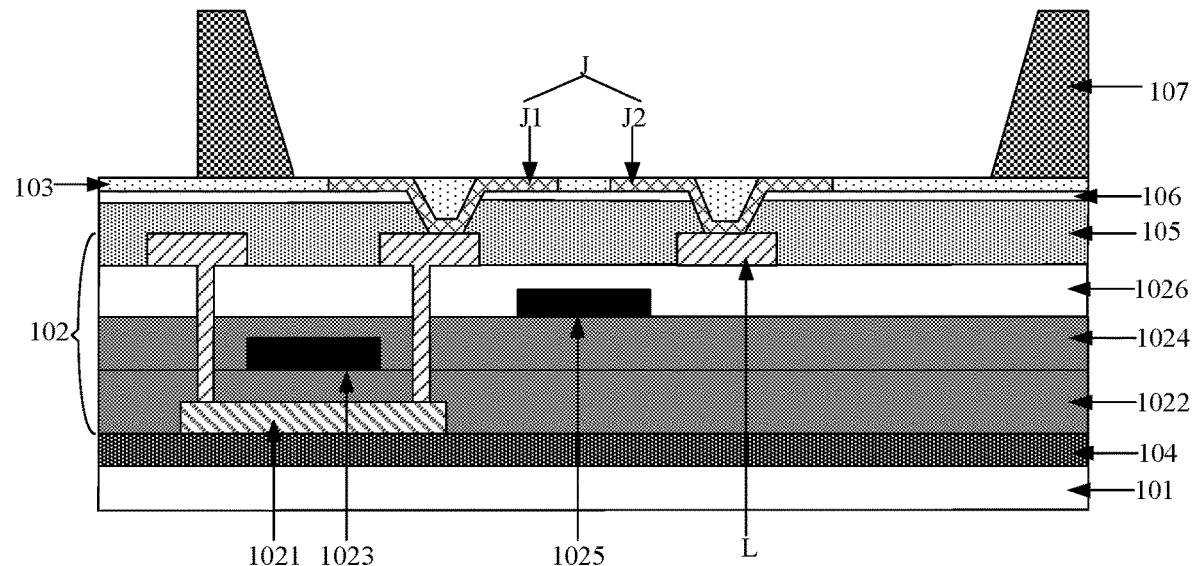
FIG. 17 is a partial schematic structural diagram of another display substrate according to an embodiment of the present disclosure.

For example, referring to FIG. 16 and FIG. 17, the retaining wall structure 107 may be formed on the insulating flat layer 103 by a patterning process.

Before step 904, the insulating flat layer is formed on the drive backplate; and in the 904, the insulating flat layer is formed on the drive backplate on which the insulating flat layer is formed.

Step 90: A conductive adhesive portion is formed in a region which the retaining wall structure surrounds.

Figure 18:
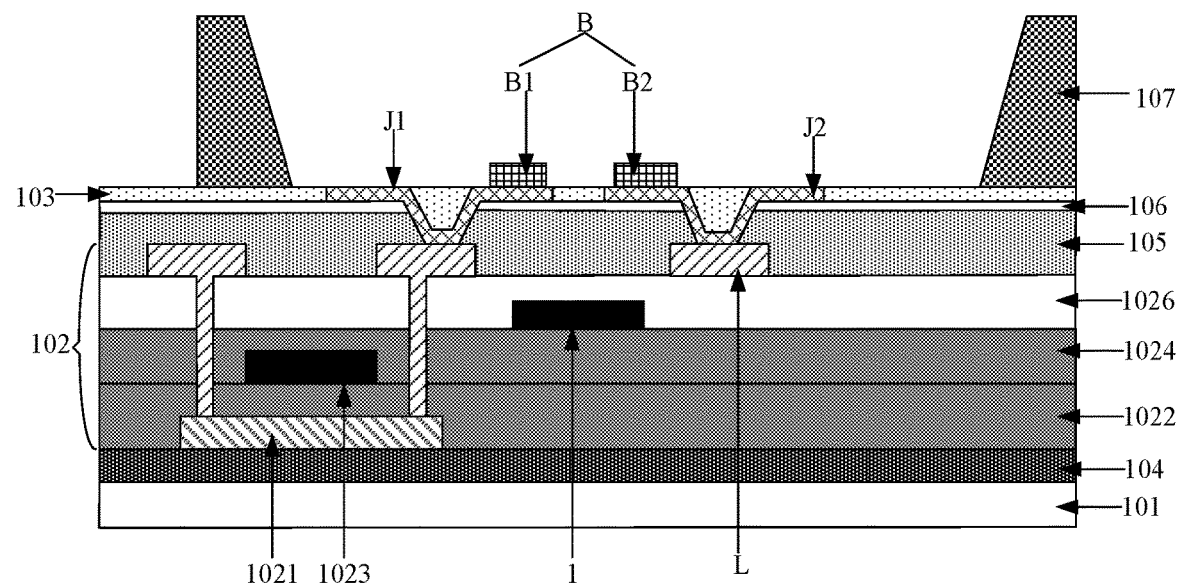
FIG. 18 is a partial schematic structural diagram of another display substrate according to an embodiment of the present disclosure.

For example, referring to FIG. 17 and FIG. 18, an adhesive portion B may be arranged on a conductive structure J in the retaining wall structure 107, thus obtaining a structure as shown in FIG. 18. Optionally, the conductive adhesive portion B may include a conductive adhesive or other conductive viscous objects. The conductive adhesive portion B may include: a first adhesive portion B1 adhered to the first conductive structure J1 and a second adhesive portion B2 adhered to the second conductive structure J2. The first adhesive portion B1 and the second adhesive portion B2 are mutually insulated.

Step 906: A plurality of micro LEDs are transferred to the base substrate on which the conductive adhesive portion is formed, such that the plurality of micro light-emitting structures are electrically connected to a plurality of conductive structures in the conductive layer in one-to-one correspondence.

For example, referring to FIG. 18 and FIG. 19, a plurality of micro LEDs W may be adsorbed by transfer equipment, such that the transfer equipment moves to above the base substrate 101 on which the conductive adhesive portion B, and an overlapped region exists in an orthographic projection of the micro LED W on the base substrate 101 and an orthographic projection of the corresponding conductive structure J on the base substrate 101. Then, the transfer equipment is pressed down, such that the micro LED W contacts with the corresponding conductive adhesive portion B. Then, the transfer equipment is lifted and the transfer equipment is separated from the micro LED to complete transfer of the micro LED, such that a display substrate 10 as shown in FIG. 8 is obtained. Moreover, the first inject layer 201 in the micro LED is electrically connected to the first conductive sub-structure J1 by the first adhesive portion B1, and the second inject layer 202 is electrically connected to the second conductive sub-structure J2 by the second adhesive portion B2.

Optionally, an embodiment of the present disclosure illustrates by taking the retaining wall structure is formed and then the micro LED is transferred as an example. Optionally, step 904 may be performed after step 903, step 905 and step 906 are performed.

Optionally, in an embodiment of the present disclosure, step 903 and step 904 may not be performed and may be replaced by the following step. For example, an insulating material layer may be formed on a side, distal from the base substrate, of the plurality of formed conductive structures; and then the insulating material layer is subjected to patterning to obtain the insulating flat layer and at least one retaining wall structure located on a side, distal from the base substrate, of the insulating flat layer, such that a structure as shown in FIG. 17 is directly obtained.

In conclusion, in a display substrate manufactured by a method according to the embodiments of the present disclosure, the retaining wall structure surrounds at least one micro LED. Furthermore, a center of a surrounding region of the retaining wall structure in the drive backplate is located within a circumscribing region of a region where a light-emitting layer of the at least one micro LED surrounded by the retaining wall structure is located. The light-emitting layer of the micro LED deviates from the center of the micro LED, but the retaining wall structure can correct a center of a light outgoing region of the at least one LED surrounded by the retaining wall structure to enable the center of the light outgoing region to be proximal to the center of the at least one LED, thus improving the display effect of the display substrate.

An embodiment of the present disclosure further provides a display device. The display device may include any one of display substrates according to the embodiments of the present disclosure. For example, the display device may be: any products or parts with display functions, such as a micro LED display panel, electronic paper, a mobile phone, a tablet personal computer, a television, a display, a laptop computer, a digital photo frame, a navigator, or the like.

It should be noted that the embodiments of the manufacturing method for the display substrate according to the present disclosure and the embodiments of the display substrate according to the present disclosure may be referenced to each other, which are not limited herein. The sequence of the steps of the embodiments of the method according to the present disclosure may be properly adjusted, the steps may be increased or reduced correspondingly according to the conditions. Any methods that are derived by a person skilled in the art based on the technical content of the present disclosure should be covered within the protection scope of the present disclosure, which are thus not elaborated herein.

Described above are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A display substrate, comprising: a drive backplate, and a plurality of micro light-emitting diodes (LEDs) and a retaining wall structure on the drive backplate; wherein
   a center of a light-emitting layer in the micro LED deviates from a center of the micro LED;
   the retaining wall structure is of an annular shape and surrounding at least one of the micro LEDs in the display substrate, and a center of a surrounding region of the retaining wall structure in the drive backplate is located within a circumscribing region of a region where the light-emitting layer of the at least one micro LED is located; and
   a distance between any position in the surrounding region and a center of the circumscribing region is greater than 5 μm, wherein the circumscribing region is a region where an orthographic projection of the light-emitting layer on the drive backplate is located.

2. The display substrate according to claim 1, wherein the center of the surrounding region coincides with the center of the circumscribing region.

3. The display substrate according to claim 1, wherein a material of the retaining wall structure comprises a reflective material.

4. The display substrate according to claim 1, wherein in a direction going distally from the drive backplate, a height of the retaining wall structure is greater than a height of the micro LED.

5. The display substrate according to claim 1, wherein an inner annular surface of the retaining wall structure is an inclined surface.

6. The display substrate according to claim 5, wherein an end of the inclined surface distal from the drive backplate inclines towards an exterior of the retaining wall structure.

7. The display substrate according to claim 1, wherein the display substrate comprises a plurality of retaining wall structures, and different retaining wall structures surround different micro LEDs.

8. The display substrate according to claim 7, wherein adjacent retaining wall structures in the display substrate are integrally molded.

9. The display substrate according to claim 1, wherein the micro LED is of an inverted structure.

10. A display device, comprising the display substrate as defined in claim 1.

11. The display device according to claim 10, wherein the display substrate also comprises: an insulating flat layer on the drive backplate, and the retaining wall structures and the micro LEDs are arranged on a side, far distal from the drive backplate, of the insulating flat layer; in a surrounding region, a surface, proximal to the micro LED, of the insulating flat layer is aligned with a surface, proximal to the micro LED, of the drive backplate; the retaining wall structures and the insulating flat layer are integrally molded;
   the micro LED is of an inverted structure, and a center of a surrounding region coincides with a center of the circumscribing region; in a direction going distally from the drive backplate, a height of the retaining wall structure is greater than a height of the micro LED; a distance between any position of the surrounding region and the center of the circumscribing region is greater than 5 μm; an inner annular surface of the retaining wall structure is an inclined surface, and an end, distal from the drive backplate, of the inclined surface inclines towards an exterior of the retaining wall structure; and
   the display substrate comprises a plurality of the retaining wall structures, and different retaining wall structures surround different micro LEDs and adjacent retaining wall structures in the display substrate are integrally molded.

12. The display substrate according to claim 1, wherein a material of the retaining wall structure comprises a light-absorbing material to absorb light emitted from the micro LED surrounded by the retaining wall structure.

13. A display substrate comprising: a drive backplate, and an insulating flat layer, a plurality of micro light-emitting diodes (LEDs) and a retaining wall structure on the drive backplate, wherein the retaining wall structures and the micro LEDs are arranged on a side, far distal from the drive backplate, of the insulating flat layer;
- a center of a light-emitting layer in the micro LED deviates from a center of the micro LED;
- the retaining wall structure is of an annular shape and surrounding at least one of the micro LEDs in the display substrate, and a center of a surrounding region of the retaining wall structure in the drive backplate is located within a circumscribing region of a region where the light-emitting layer of the at least one micro LED is located;
- a material of the insulating flat layer comprises a reflective material; and
- in a surrounding region, a surface, proximal to the micro LED, of the insulating flat layer is aligned with a surface, proximal to the micro LED, of the drive backplate.

14. The display substrate according to claim 13, wherein a material of the retaining wall structure comprises a reflective material.

15. The display substrate according to claim 13, wherein the retaining wall structure and the insulating flat layer are integrally molded.

16. The display substrate according to claim 15, wherein the micro LED is of an inverted structure; a center of the surrounding region coincides with a center of a circumscribing region; a material of the retaining wall structure comprises a reflective material; in a direction going distally from the drive backplate, a height of the retaining wall structure is greater than a height of the micro LED; a distance between any position in the surrounding region and the center of the circumscribing region is greater than 5 µm; an inner annular surface of the retaining wall structure is an inclined surface, and an end, far distal from the drive backplate, of the inclined surface inclines towards an exterior of the retaining wall structure; and
- the display substrate comprises a plurality of retaining wall structures, and different retaining wall structures surround different micro LEDs and adjacent retaining wall structures in the display substrate are integrally molded.

17. A manufacturing method for a display substrate, comprising:
- forming a plurality of micro LEDs and a retaining wall structure on the drive backplate; wherein
- a center of a light-emitting layer in the micro LED deviates from a center of the micro LED;
- the retaining wall structure is of an annular shape; the retaining wall structure corresponds to at least one micro LED in the display substrate; and a center of a surrounding region of the retaining wall structure in the drive backplate is located within a circumscribing region of a region where a light-emitting layer of the at least one micro LED is located; and
- a distance between any position in the surrounding region and a center of the circumscribing region is greater than 5 µm, wherein the circumscribing region is a region where an orthographic projection of the light-emitting layer on the drive backplate is located.

18. The method according to claim 17, wherein before forming the plurality of micro LEDs and the retaining wall structure on the drive backplate, the method further comprises:
- forming an insulating flat layer on the drive backplate; and
- forming the plurality of micro LEDs and the retaining wall structure on the drive backplate comprises:
- forming the plurality of micro LEDs and the retaining wall structure on the drive backplate on which the insulating flat layer is formed;
- wherein in the surrounding region, a surface, proximal to the micro LED, of the insulating flat layer is aligned with a surface, proximal to the micro LED, of the drive backplate.

19. The method according to claim 17, wherein forming the plurality of micro LEDs and the retaining wall structure on the drive backplate comprises:
- forming an insulating material layer on the drive backplate;
- performing patterning on the insulating material layer to obtain an insulating flat layer and the retaining wall structure located on a side, distal from the drive backplate, of the insulating flat layer; and
- forming the plurality of micro LEDs on the drive backplate on which the insulating flat layer and the retaining wall structure are formed.

20. The method according to claim 19, wherein the micro LED is of an inverted structure, and a center of the surrounding region coincides with a center of the circumscribing region; a material of the retaining wall structure comprises a reflective material; in a direction going distally from the drive backplate, a height of the retaining wall structure is greater than a height of the micro LED; a distance between any position of the surrounding region and the center of the circumscribing region is greater than 5 µm; an inner annular surface of the retaining wall structure is an inclined surface, and an end, distal from the drive backplate, of the inclined surface inclines towards an exterior of the retaining wall structure; and
- the display substrate comprises a plurality of the retaining wall structures, and different retaining wall structures surround different micro LEDs and adjacent retaining wall structures in the display substrate are integrally molded.

* * * * *